United States Patent
Su

(10) Patent No.: US 6,882,383 B1
(45) Date of Patent: Apr. 19, 2005

(54) FULL-COLOR ORGANIC LIGHT-EMITTING DIODE DISPLAY AND METHOD OF FABRICATING THE SAME

(75) Inventor: Chih-Hung Su, Hsinchu (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 10/725,152

(22) Filed: Dec. 1, 2003

(30) Foreign Application Priority Data

Sep. 30, 2003 (TW) ........................... 92126956 A

(51) Int. Cl.$^7$ ............................................. G02F 1/1335
(52) U.S. Cl. ..................... 349/69; 349/147; 349/106; 349/96; 313/498; 313/506; 315/169.3
(58) Field of Search ..................... 349/69, 96, 106, 349/108, 104, 113, 129, 147, 155, 156; 313/498, 506, 509; 428/917; 257/72, 89, 98; 315/169.3, 169.1

(56) References Cited

U.S. PATENT DOCUMENTS

| | | | |
|---|---|---|---|
| 6,114,805 A | 9/2000 | Codama et al. ............. 313/509 |
| 6,121,726 A | 9/2000 | Codama et al. ............. 313/504 |
| 6,433,487 B1 | * 8/2002 | Yamazaki ................ 315/169.3 |
| 6,507,379 B1 | * 1/2003 | Yokoyama et al. ........... 349/69 |
| 6,521,912 B1 | * 2/2003 | Sakama et al. ................ 257/57 |
| 6,731,064 B2 | * 5/2004 | Andry et al. ................ 313/506 |

\* cited by examiner

*Primary Examiner*—Haissa Philogene
(74) *Attorney, Agent, or Firm*—Thomas, Kayden, Horstemeyer & Risley

(57) ABSTRACT

A full-color organic light-emitting diode (OLED) display. The display comprises a substrate, a white light-emitting OLED, a first passivation layer, stacked layers of a color-converting layer and a color filter, and a second passivation layer. The white light-emitting OLED comprises an anode, a cathode, and at least one white light-emitting organic material layer disposed between the anode and the cathode. The first passivation layer is disposed covering the surface and sidewalls of the white light-emitting OLED. The stacked layers disposed on the first passivation layer are separated at intervals. The second passivation layer is disposed covering the surface and sidewalls of the stacked layers.

35 Claims, 3 Drawing Sheets

FULL-COLOR ORGANIC LIGHT-EMITTING DIODE DISPLAY AND METHOD OF FABRICATING THE SAME

BACKGROUND OF THE INVENTION

1. Field of the Invention

The present invention relates to an organic light-emitting diode display and in particular to a full-color organic light-emitting diode display using top emission.

2. Description of the Related Art

Flat panel displays have become important elements in electronic products such as notebook computers and others. Organic light-emitting diode displays employed therein have advantages of light emission, high luminous efficiency, wide viewing angle, fast response speed, high reliability, full color, low-voltage drive, low power consumption, and simple fabrication, making them a frequent choice in device configuration.

The structure and the manufacture of a conventional full color OLED display involve using a precision photomask to achieve a pixel array of red, green, and blue. (RGB) colors in a small molecule system, and a color filter to achieve the pixel array on a white light OLED device, light converting layers to convert the original blue or purple light into other colors of light, employing medium stacking layers of various thickness to convert original wide-band light spectrum to RGB colors, and stacking devices of RGB colors on the same pixel element on a two-sided transparent OEL device.

Generally, most conventional OLED displays use bottom emission, as disclosed in U.S. Pat. Nos. 6,114,805 and 6,121,726.

However, the open area of the OLED display for emission is usually not large enough for strong light intensity.

SUMMARY OF THE INVENTION

Accordingly, an object of the invention is to provide a full-color organic light-emitting diode (OLED) display emitting light from the top of the display, providing enhanced light intensity and life of the display.

Another object of the invention is to provide a full-color OLED display with reduced thickness.

It is further another object of the invention to provide a full-color OLED display with simplified structure.

To achieve the above objects, the present invention provides a full-color OLED display comprising a substrate, a white light-emitting OLED, a first passivation layer, stacked layers of a color-converting layer and color filter, and a second passivation layer. The white light-emitting OLED, comprising anodes, cathodes, and at least one white light-emitting organic material layer is disposed on the substrate. The white light-emitting organic material layer is disposed between the anode and the cathode. The first passivation layer is disposed covering the surface and sidewalls of the white light-emitting OLED. The stacked layers of color-converting layer and color filter are disposed on the first passivation layer and separated at intervals. As well, the second passivation layer is disposed covering the surface and sidewalls of the stacked layers.

The material of the substrate comprises glass, the first passivation layer, silicon nitride ($Si_3N_4$) and silicon oxide ($SiO_2$), and the second passivation layer, silicon nitride ($Si_3N_4$) and silicon oxide ($SiO_2$).

A reflective layer is further disposed between the substrate and the white light-emitting OLED, comprising chromium (Cr) and aluminum (Al).

The display can be actively driven, such that a plurality of transistors are further disposed on the substrate to electrically connect with the cathodes.

The display can, conversely, be passively driven, in which case the anodes, parallel with each other and separated at intervals, are perpendicular to the cathodes, also parallel with each other and separated at intervals.

The stacked layers are separated by a plurality of ribs at intervals, the material of the rib comprising a resin.

A polarized plate is further disposed on the second passivation layer.

A buffer is further disposed between the white light-emitting OLED and the first passivation layer. The anodes and cathodes comprise transparent conductive material.

To achieve the above objects, the present invention further provides a method of fabricating a full-color OLED display. First, a substrate is provided. Next, a white light-emitting OLED comprising anodes, cathodes, and at least one white light-emitting organic material layer is formed on the substrate, wherein the white light-emitting organic material layer is disposed between the anodes and the cathodes. A first passivation layer is formed to cover the surface and sidewalls of the white light-emitting OLED. A plurality of ribs are formed on the first passivation layer, separated at intervals. Stacked layers of a color-converting layer and a color filter are disposed in the intervals between the ribs. Finally, a second passivation layer is formed to cover the surface and sidewalls of the stacked layers.

A reflective layer is further formed on the substrate, and a polarized plate is formed on the second passivation layer. As well, a buffer is formed on the white light-emitting OLED.

The color-converting layer and color filter are formed by spin-coating, while the first passivation layer and the second passivation layer are formed by sputtering.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

A preferred embodiment of the present invention is now described with reference to the figures.

Figure 6:
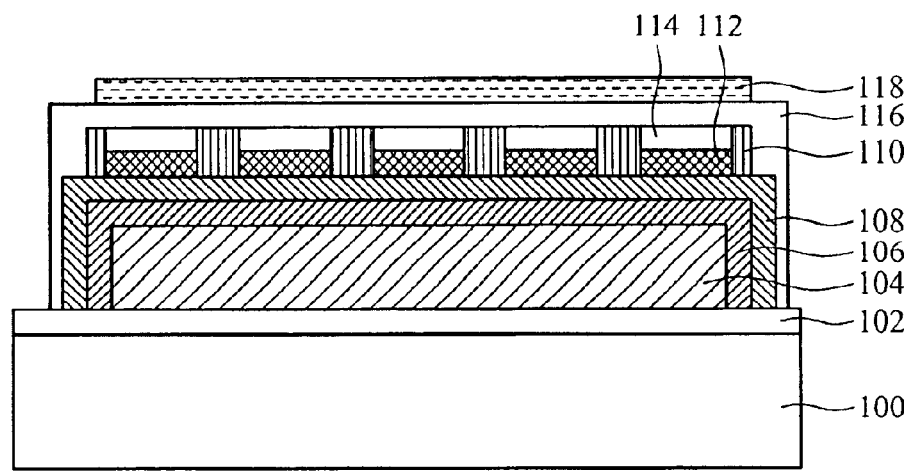

In FIG. 6, a full-color organic light-emitting diode (OLED) display using top emission according to the present invention is shown. The display comprises a substrate 100, a white light-emitting OLED 104, a first passivation layer 108, stacked layers of a color-converting layer 112 and a color filter 114, and a second passivation layer 116.

The substrate 100 preferably comprises glass. The white light-emitting OLED 104 comprising anodes, cathodes, and at least one white light-emitting organic material layer, is disposed over the substrate 100. The anodes and the cathodes are made of transparent conductive materials, such as indium tin oxide (ITO), for example. A reflective layer 102 can be further disposed between the substrate 100 and the white light-emitting OLED 104. The material of the reflective layer 102 preferably comprises chromium (Cr) and aluminum (Al). Most light from the white light-emitting OLED 104 is reflected toward the color-converting layers 112 and color filters 114 by the reflective layer 102.

The first passivation layer 108 is disposed covering the surface and sidewalls of the white light-emitting OLED 104. The first passivation layer 108 comprising silicon nitride ($Si_3N_4$) and silicon oxide ($SiO_2$) is preferably formed by sputtering. However, the white light-emitting OLED 104 overlying the first passivation layer 108 may be damaged during sputtering. Thus, a buffer 106 comprising a polymer material is preferably formed on the white light-emitting OLED 104 by spin-coating before formation of the first passivation layer 108.

The stacked layers of a color-converting layer 112 and a color filter 114 are disposed on the first passivation layer 108 and separated at intervals to change and filter light from the white light-emitting OLED 104, such that blue light, green light, and red light all can be produced. Only light of specific wavelength can pass through the color filter 114. The color-converting layer 112 preferably comprising an organic material can absorb light of specific wavelength and convert it to another wavelength. Thus, wavelength, primary color of the full-color light, blue light, red light, and green light can be controlled.

The stacked layers of the color-converting layer 112 and the color filter 114 are separated by a plurality of ribs 110 at intervals. The ribs 110, comprising a resin, can be set in arrays.

As well, the second passivation layer 116 is disposed on the entire display to cover the surface and sidewalls of the stacked layers, preventing machine and moisture damage. The second passivation layer 116 comprises silicon nitride ($Si_3N_4$) and silicon oxide ($SiO_2$) or other transparent materials.

Moreover, a polarized plate 118 is further disposed on the second passivation layer 116 to enhance contrast.

Figure 7:
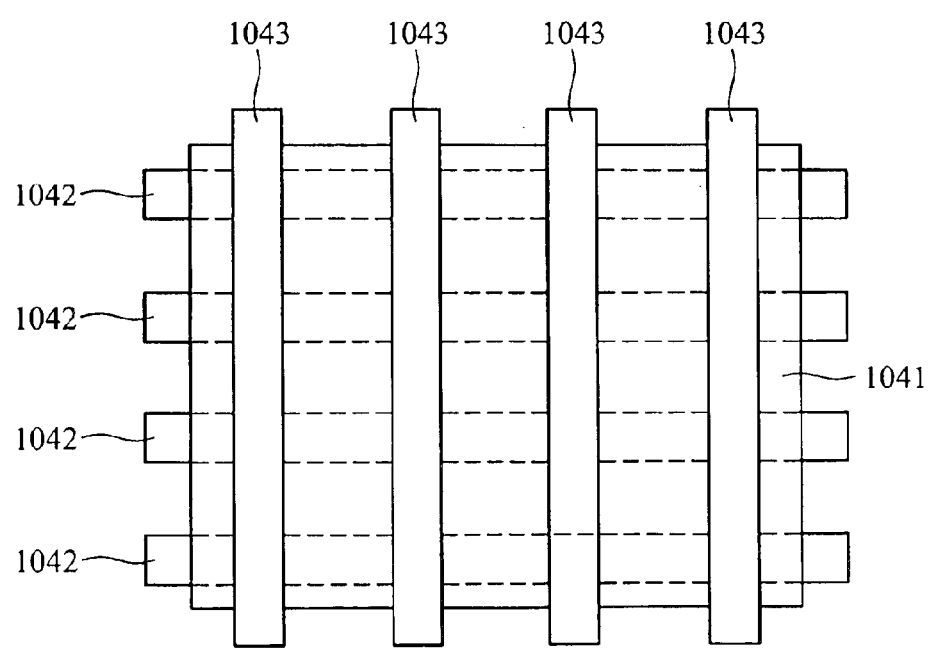
FIG. 7 is a top view of a white light-emitting OLED of the passively driven full-color OLED display according to the invention.

The display can be actively or passively driven. When actively driven, a plurality of transistors respectively corresponding to each of the stacked layers of color-converting layer 112 and the color filter 114 are disposed on the substrate 100 in advance to electrically connect with the cathodes to act as a switch in the circuit layout to determine if light is emitting from each of the stacked layers. As shown in FIG. 7, when the display is passively driven, the anodes 1042, parallel with each other and separated at intervals, are perpendicular to the cathodes 1043, also parallel with each other and separated at intervals. Thus, each of the intersection points of the anodes 1042 and cathode 1043 is a pixel respectively corresponding to each of the stacked layers of color-converting layer 112 and the color filter 114. The anodes 1042 and cathodes 1043 can be made of transparent conductive material.

As a result, a full-color OLED display using top emission is obtained. Each of the stacked layers of color-converting layer 112 and the color filter 114 corresponds to a pixel.

The formation of the full-color OLED display according to the present invention is described as follows.

Figure 1:
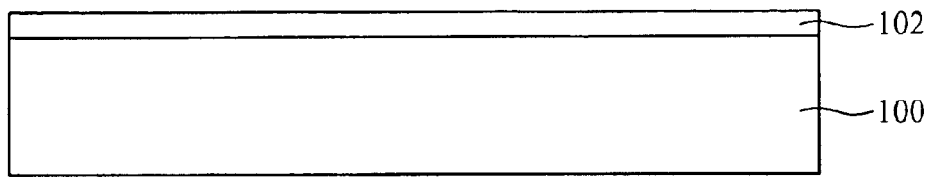
FIGS. 1 through 6 are cross-sections illustrating a method of fabricating a full-color OLED display according to the invention.

First, in FIG. 1, the substrate 100 is provided, and the reflective layer 102 comprising chromium (Cr) and aluminum (Al) is formed thereon by sputtering.

Figure 2:
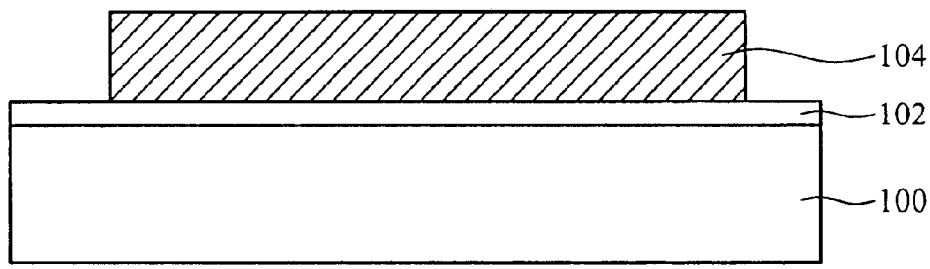

In FIG. 2, the white light-emitting OLED 104 is formed on the reflective layer 102, comprising the cathodes, the anodes, and at least one white light-emitting organic electroluminescent material. The anodes and the cathodes can be arranged according to the driving method of the display as mentioned above, and transistors can be formed when the display is actively driven. The arrangement and the relationship of the anodes, cathodes, transistors, and the stacked layers of the color-converting layer 112 and the color filter 114 are described above, thus, for brevity, are not illustrated again.

Figure 3:
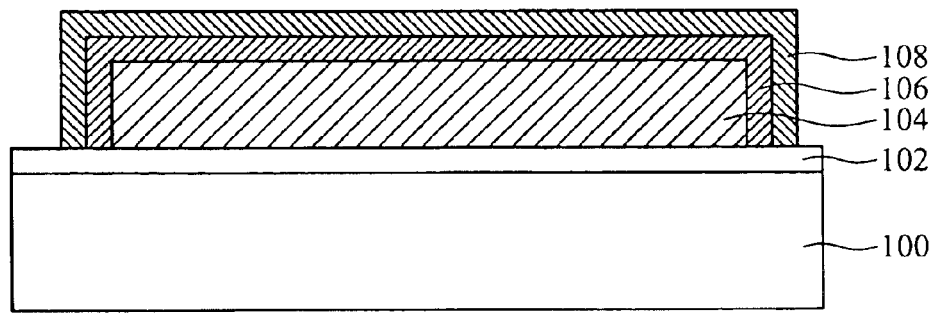

In FIG. 3, the buffer 106 is formed on the white light-emitting OLED 104, preferably by spin-coating. The first passivation layer 108 is subsequently formed to cover the buffer 106.

Figure 4:
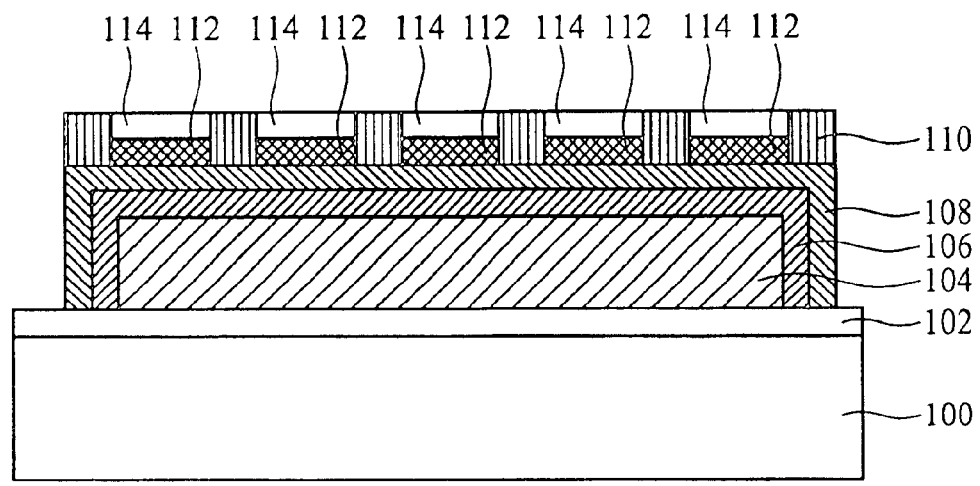

In FIG. 4, the ribs 110 are formed on the first passivation layer 108, preferably by screen printing, and are separated from each other at intervals. Subsequently, the color-converting layer 112 and the color filter 114 are filled into the intervals between the ribs 110 by spin-coating.

Figure 5:
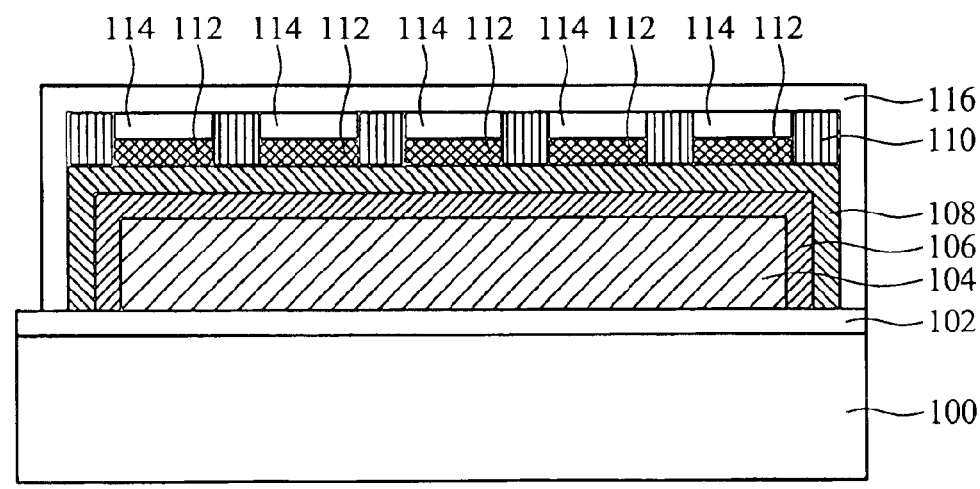

In FIG. 5, the second passivation layer 116 is formed on the surface and sidewalls of the stacked layers of the color-converting layer 112 and the color filter 114 by sputtering to cover the whole display.

In FIG. 6, the polarized plate 118 is formed on the second passivation layer 116 to enhance contrast.

There are several advantages to the present invention. First, the full-color OLED display uses top emission, with increased emission area, enhancing intensity of light and life of the device. Second, only one substrate is required, thereby both thickness and cost of the display are reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A full-color organic light-emitting diode (OLED) display, comprising:
   a substrate;
   a white light-emitting OLED, disposed over the substrate, comprising anodes, cathodes, and at least one white light-emitting organic material layer disposed between the anode and the cathode;
   a first passivation layer, covering the surface and sidewalls of the white light-emitting OLED;
   stacked layers of a color-converting layer and a color filter, disposed on the first passivation layer and separated at intervals; and
   a second passivation layer, covering the surface and sidewalls of the stacked layers.

2. The full-color OLED display as claimed in claim 1, wherein the material of the substrate comprises glass.

3. The full-color OLED display as claimed in claim 1, further comprising a reflective layer disposed between the substrate and the white light-emitting OLED.

4. The full-color OLED display as claimed in claim 3, wherein the material of the reflective layer comprises chromium (Cr) and aluminum (Al).

5. The full-color OLED display as claimed in claim 1, wherein the display is actively driven.

6. The full-color OLED display as claimed in claim 5, further comprising a plurality of transistors disposed on the substrate and electrically connecting with the cathodes.

7. The full-color OLED display as claimed in claim 1, wherein the display is passively driven.

8. The full-color OLED display as claimed in claim 7, wherein the anodes, parallel with each other and separated at intervals, are perpendicular to the cathodes, also parallel with each other and separated at intervals.

9. The full-color OLED display as claimed in claim 1, wherein the material of the first passivation layer comprises silicon nitride ($Si_3N_4$) and silicon oxide ($SiO_2$).

10. The full-color OLED display as claimed in claim 1, wherein the stacked layers are separated by a plurality of ribs at intervals.

11. The full-color OLED display as claimed in claim 1, wherein the material of the ribs comprises a resin.

12. The full-color OLED display as claimed in claim 1, wherein the second passivation layer comprises silicon nitride ($Si_3N_4$) and silicon oxide ($SiO_2$).

13. The full-color OLED display as claimed in claim 1, further comprising a polarized plate disposed on the second passivation layer.

14. The full-color OLED display as claimed in claim 1, further comprising a buffer disposed between the white light-emitting OLED and the first passivation layer.

15. The full-color OLED display as claimed in claim 1, wherein the anodes comprise transparent conductive material.

16. The full-color OLED display as claimed in claim 1, wherein the cathodes comprise transparent conductive material.

17. A method of fabricating a full-color OLED display, comprising:

providing a substrate;

forming a white light-emitting OLED comprising anodes, cathodes, and at least one white light-emitting organic material layer on the substrate, wherein the white light-emitting organic material layer is disposed between the anodes and the cathodes;

forming a first passivation layer to cover the surface and sidewalls of the white light-emitting OLED;

forming a plurality of ribs separated at intervals on the first passivation layer;

filling stacked layers of a color-converting layer and a color filter in the intervals between the ribs; and forming a second passivation layer to cover the surface and sidewalls of the stacked layers.

18. The method as claimed in claim 17, wherein the material of the substrate comprises glass.

19. The method as claimed in claim 17, before formation of the white light-emitting OLED, further comprising forming a reflective layer on the substrate.

20. The method as claimed in claim 19, wherein the material of the reflective layer comprises chromium (Cr) and aluminum (Al).

21. The method as claimed in claim 1, wherein the display is actively driven.

22. The method as claimed in claim 5, further comprising forming a plurality of transistors on the substrate to electrically connect with the cathodes.

23. The method as claimed in claim 1, wherein the display is passively driven.

24. The method as claimed in claim 23, wherein the anodes, parallel with each other and separated at intervals, are perpendicular to the cathodes, also parallel with each other and separated at intervals.

25. The method as claimed in claim 17, wherein the material of the first passivation layer comprises silicon nitride ($Si_3N_4$) and silicon oxide ($SiO_2$).

26. The method as claimed in claim 17, wherein the material of the ribs comprises a resin.

27. The method as claimed in claim 17, wherein the second passivation layer comprises silicon nitride ($Si_3N_4$) and silicon oxide ($SiO_2$).

28. The method as claimed in claim 17, further comprising, after forming the second passivation layer, forming a polarized plate thereon.

29. The method as claimed in claim 17, further comprising, before formation of the first passivation layer, forming a buffer on the white light-emitting OLED.

30. The method as claimed in claim 17, wherein the anode comprises transparent conductive material.

31. The method as claimed in claim 17, wherein the cathode comprises transparent conductive material.

32. The method as claimed in claim 17, wherein the color-converting layer is formed by spin-coating.

33. The method as claimed in claim 17, wherein the color filter is formed by spin-coating.

34. The method as claimed in claim 25, wherein the first passivation layer is formed by sputtering.

35. The method as claimed in claim 27, wherein the second passivation layer is formed by sputtering.

* * * * *